(12) United States Patent
Kim

(10) Patent No.: US 8,547,762 B2
(45) Date of Patent: Oct. 1, 2013

(54) REPAIR CIRCUIT AND CONTROL METHOD THEREOF

(75) Inventor: Sung Ho Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 139 days.

(21) Appl. No.: 13/190,046

(22) Filed: Jul. 25, 2011

(65) Prior Publication Data

US 2012/0120737 A1    May 17, 2012

(30) Foreign Application Priority Data

Nov. 16, 2010    (KR) .......................... 10-2010-0113768

(51) Int. Cl.
*G11C 7/00*    (2006.01)
(52) U.S. Cl.
USPC .... 365/200; 365/225.7; 365/201; 365/189.07
(58) Field of Classification Search
USPC .......................... 365/200, 225.7, 201, 189.07
See application file for complete search history.

(56) References Cited

U.S. PATENT DOCUMENTS

| | | | |
|---|---|---|---|
| 7,573,763 B2 * | 8/2009 | Im et al. .......................... | 365/200 |
| 8,004,913 B2 * | 8/2011 | Gajjewar et al. .............. | 365/200 |
| 8,031,544 B2 * | 10/2011 | Kim et al. ..................... | 365/200 |

FOREIGN PATENT DOCUMENTS

| | | |
|---|---|---|
| KR | 10-1999-0011067 A | 2/1999 |
| KR | 10-2009-0014823 A | 2/2009 |

\* cited by examiner

*Primary Examiner* — David Lam
(74) *Attorney, Agent, or Firm* — William Park & Associates Patent Ltd.

(57) ABSTRACT

A semiconductor memory apparatus including a repair circuit may comprise: a fuse set block configured to store a repair address, compare the repair address with an input address, and generate a primary repair signal; and a redundancy control block configured to receive the primary repair signal, determine whether a repair cell in a repair memory designated by the primary repair signal is failed or not, and generate a secondary repair signal which repair the failed repair cell with another repair cell in the repair memory.

10 Claims, 6 Drawing Sheets

REPAIR CIRCUIT AND CONTROL METHOD THEREOF

CROSS-REFERENCES TO RELATED APPLICATION

The present application claims priority under 35 U.S.C. §119(a) to Korean Patent Application No. 10-2010-0113768, filed on Nov. 16, 2010, in the Korean Intellectual Property Office, which is incorporated herein by reference in its entirety as if set forth in full.

BACKGROUND

1. Technical Field

Various embodiments of the present invention relate to semiconductor apparatus, and related control methods. In particular, certain embodiments relate to a repair circuit and a control method thereof in a semiconductor memory apparatus.

2. Related Art

A semiconductor apparatus, more specifically a semiconductor memory apparatus, typically includes a repair circuit for storing information on a failed memory cell and replacing the failed memory cell with a redundant memory cell based on the stored information.

FIG. 1 is a block diagram of a semiconductor apparatus including a repair circuit according to the conventional art. As illustrated in FIG. 1, a semiconductor apparatus 1 according to the conventional art includes a memory block 10, a fuse set block 20, a NAND gate ND1, a decoder 30, and a column selection block 40.

The memory block 10 includes normal column lines NY<0:N> coupled to memory cells and redundant column lines RY<0:3>.

As the normal column lines NY<0:N> or the redundant column lines RY<0:3> for repairing the normal column lines NY<0:N> are activated, it is possible to perform an operation for recording data on a corresponding memory cell or reading the recorded data from the corresponding memory cell.

The fuse set block 20 includes a plurality of fuse sets fuse set 0 to fuse set 3.

The fuse set block 20 compares previously stored repair information with address signals A<3:9> in response to fuse control signals FC1 and FC2 and generates repair signals RYSb<0:3>.

The decoder 30 decodes the address signals A<3:9> and generates decoding signals NYb<0:N> for selecting one of the normal column lines NY<0:N>.

The NAND gate ND1 substantially prevents the decoder 30 from outputting the decoding signals NYb<0:N> if any one of the repair signals RYSb<0:3> is activated.

The column selection block 40 selects and activates the normal column lines NY<0:N> corresponding to the decoding signals NYb<0:N> or the redundant column lines RY<0:3> corresponding to the repair signals RYSb<0:3> in response to a strobe signal STROBE.

FIG. 2 is diagram illustrating the internal configuration of the fuse set illustrated in FIG. 1. As illustrated in FIG. 2, the fuse set 0 (21) includes an enable fuse 22, a plurality of address fuses 23, a comparator 24, and a NAND gate ND11.

The plurality of address fuses 23 output fuse signals FA<3:9> based on whether a fuse has been cut (or ruptured). That is, when the fuse has been ruptured, the plurality of address fuses 23 output the fuse signals FA<3:9> at a logic high level. When the fuse has not been ruptured, the plurality of address fuses 23 output the fuse signals FA<3:9> at a logic low level.

When the address signals A<3:9> are '0000000 (binary)', none of the plurality of address fuses 23 is not ruptured. In such a case, it is not possible to identify whether the fuse set 0 (21) is not used or an address '0 (decimal number)' is to be replaced.

In this regard, the enable fuse 22 is added in order to determine the use or non-use of the fuse set 0 (21). That is, a fuse is in the enable fuse 22 is ruptured or not, so that it is possible to store information on the use of the fuse set 0 (21) and information on the replacement of the address '0 (decimal number)'.

If the fuse has been ruptured, the enable fuse 22 outputs a fuse enable signal FUSE_EN at a logic high level. If the fuse has not been ruptured, the enable fuse 22 outputs the fuse enable signal FUSE_EN at a logic low level.

The comparator 24 compares the address signals A<3:9> with the fuse signals FA<3:9> and outputs a comparison signal CMP_SUM. That is, when the address signals A<3:9> match the fuse signals FA<3:9>, the comparator 24 outputs the comparison signal CMP_SUM at a logic high level. When the address signals A<3:9> do not match the fuse signals FA<3:9>, the comparator 24 outputs the comparison signal CMP_SUM at a logic low level.

The NAND gate ND11 activates the repair signal RYSb<0> to a logic low level if any one of the fuse enable signal FUSE_EN and the comparison signal CMP_SUM is at a logic high level.

The plurality of fuse sets fuse set 1 to fuse set 3 may have substantially the same configuration as that of the fuse set 0 (21).

FIG. 3A is a circuit diagram of the address fuse illustrated in FIG. 2. As illustrated in FIG. 3A, the address fuse 23 includes a plurality of inverters IV1 to IV3, a plurality of transistors M1 and M2, and a fuse.

FIG. 3B is a diagram illustrating the operation timing of the address fuse illustrated in FIG. 2. As illustrated in FIG. 3B, a fuse signal FA<#> is initialized to a logic high level in response to the fuse control signal FC1.

After the fuse control signal FC2 transits to a logic high level, if the fuse is ruptured, the fuse signal FA<#> is substantially maintained at a logic high level. If the fuse is not ruptured, the fuse signal FA<#> transits to a logic low level.

Each of the plurality of fuse sets fuse set 0 to fuse set 3, which are main elements of the repair circuit of the semiconductor apparatus 1 according to the conventional art as described above, further includes the enable fuse 22, in addition to the plurality of address fuses 23.

While the area occupied by the fuse in the semiconductor apparatus is large, since the conventional repair circuit needs the enable fuse in addition to the address fuses for actually storing address information, a circuit area may be increased.

SUMMARY

Accordingly, there is a need for an improved semiconductor memory system that is capable of reducing a circuit area.

To attain the advantages and in accordance with the purposes of the invention, as embodied and broadly described herein, one exemplary aspect of the present invention may provide a repair circuit of a semiconductor circuit, which may comprise: a fuse set block configured to store a repair address, compare the repair address with an input address, and generate a primary repair signal; and a redundancy control block configured to receive the primary repair signal, determine whether a repair cell in a repair memory designated by the primary repair signal is failed or not, and generate a secondary repair signal which repair the failed repair cell with another repair cell in the repair memory.

In another exemplary embodiment of the present invention, a method of controlling a repair circuit provided with a first fuse set and a second fuse set may comprise: when one address is to be repaired, storing the address to be repaired in the first fuse set; and storing a specific address in the second fuse set.

In still another exemplary embodiment of the present invention, when the one address is to be repaired and has a value of '0 (decimal number)', an address having a value different from a value of the address to be repaired may be stored in the first fuse set.

In still another exemplary embodiment of the present invention, when the one address is to be repaired and has a value other than '0 (decimal number)', the address to be repaired may be stored in the first fuse set.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
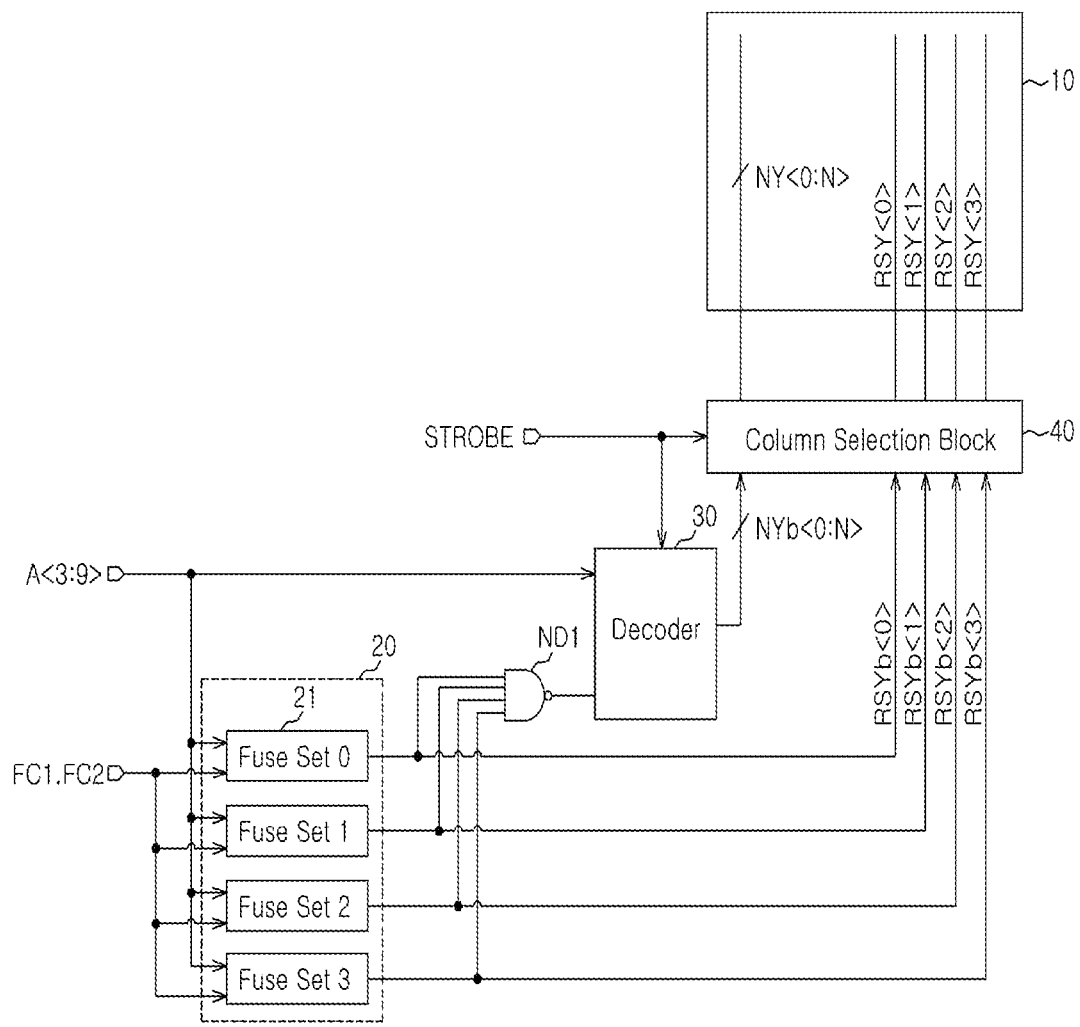
FIG. 1 is a block diagram of a semiconductor apparatus including a repair circuit according to the conventional art.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 4:
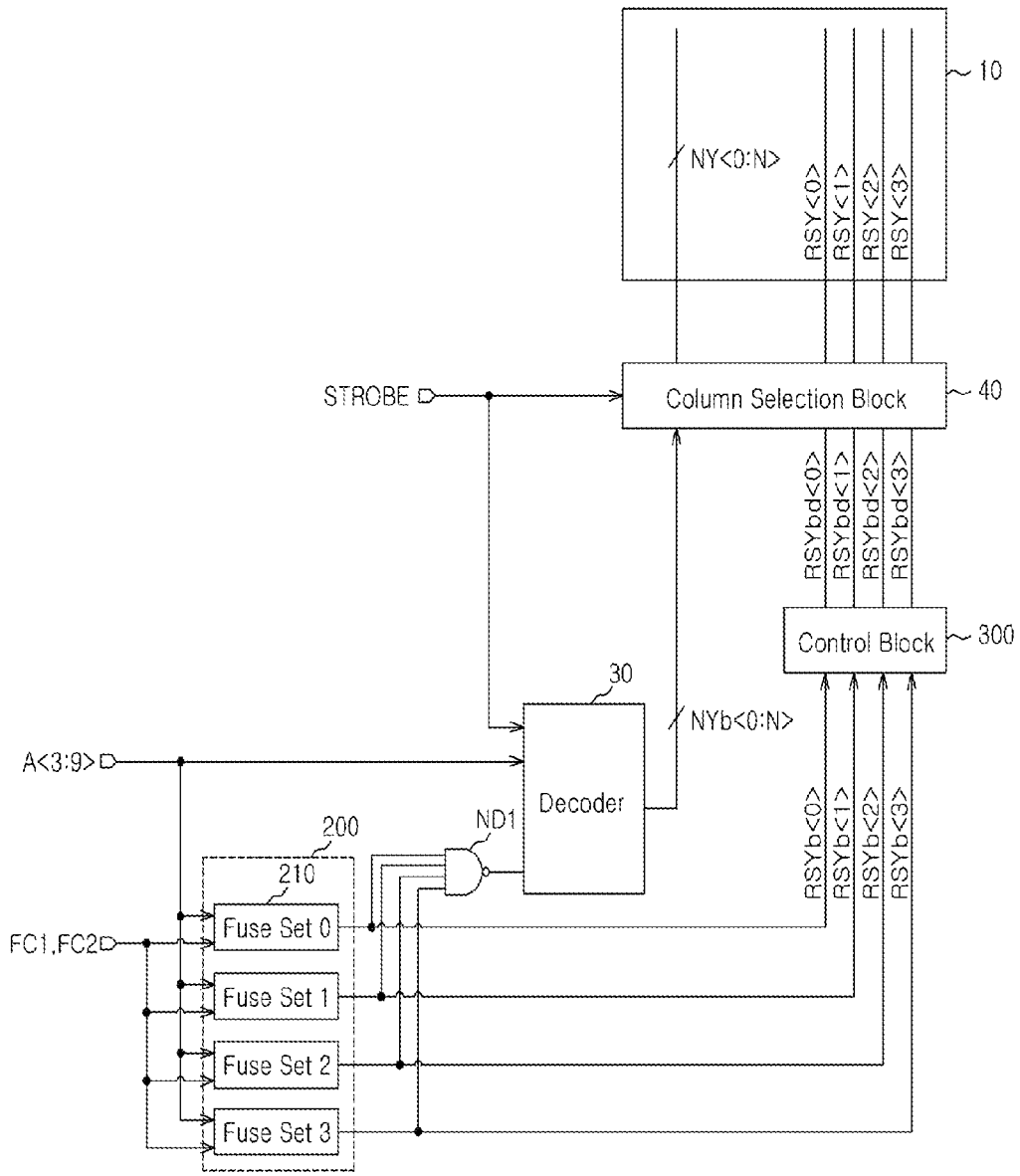
FIG. 4 is a block diagram of a semiconductor apparatus including a repair circuit according to an embodiment of the present invention.

FIG. 4 is a block diagram of a semiconductor apparatus including a repair circuit according to an embodiment of the present invention. As illustrated in FIG. 4, a semiconductor apparatus 100 according to an exemplary embodiment of the invention may comprise a memory block 10, a fuse set block 200, a NAND gate ND1, a decoder 30, a redundancy control block 300, and a column selection block 40.

The memory block 10 includes normal column lines NY<0:N> coupled to normal memory cells and redundant column lines RY<0:3> coupled to redundant memory cells.

The memory block 10 may be a cell mat which is a part of the entire memory area.

That is, a repair circuit according to the exemplary embodiment of the invention may include a plurality of cell mats.

As the normal column lines NY<0:N> or the redundant column lines RY<0:3> for repairing the normal column lines NY<0:N> are activated, it is possible to perform an operation for recording data on a corresponding memory cell or reading the is recorded data from the corresponding memory cell.

The fuse set block 200 includes a plurality of fuse sets fuse set 0 to fuse set 3.

The fuse set block 200 is configured to store repair addresses, compare the previously stored repair addresses with address signals A<3:9> in response to fuse control signals FC1 and FC2, and generate primary repair signals RYSb<0:3>.

The decoder 30 is configured to decode the address signals A<3:9> and generate decoding signals NYb<0:N> for selecting one of the normal column lines NY<0:N>.

The NAND gate ND1 is configured to substantially prevent the decoder 30 from outputting the decoding signals NYb<0:N> if any one of the primary repair signals RYSb<0:3> is activated.

The redundancy control block 300 is configured to determine whether the primary repair signals RYSb<0:3> are to be secondarily repaired and generate secondary repair signals RYSbd<0:3>.

The column selection block 40 is configured to select and activate the normal column lines NY<0:N> corresponding to the decoding signals NYb<0:N> or the redundant column lines RY<0:3> corresponding to the secondary repair signals RYSbd<0:3> in response to a strobe signal STROBE.

Figure 5:
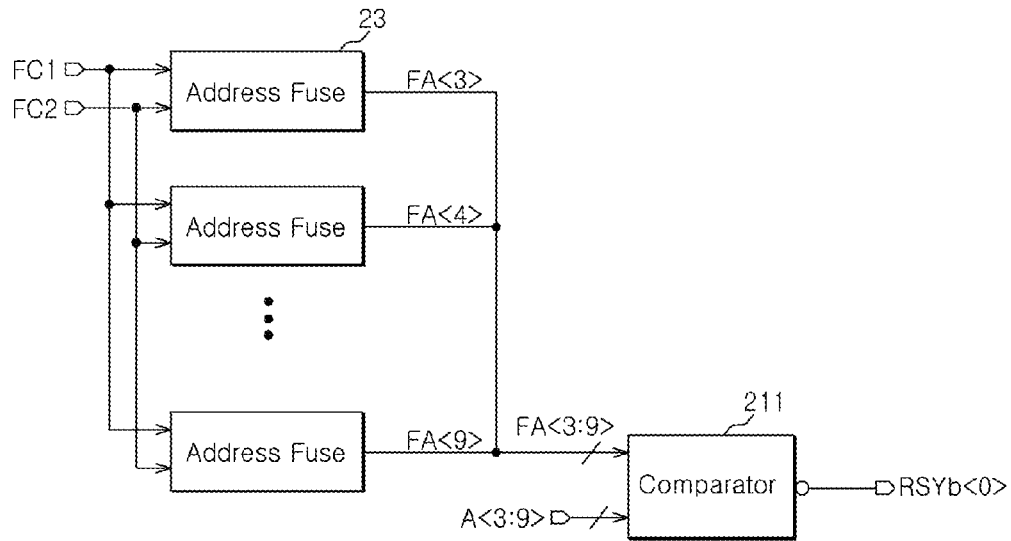
FIG. 5 is diagram illustrating the internal configuration of the fuse set illustrated in FIG. 4.

FIG. 5 is diagram illustrating the internal configuration of the fuse set illustrated in FIG. 4. As illustrated in FIG. 5, the fuse set (210) may comprise a plurality of address fuses 23 and a comparator 211.

Figure 2:
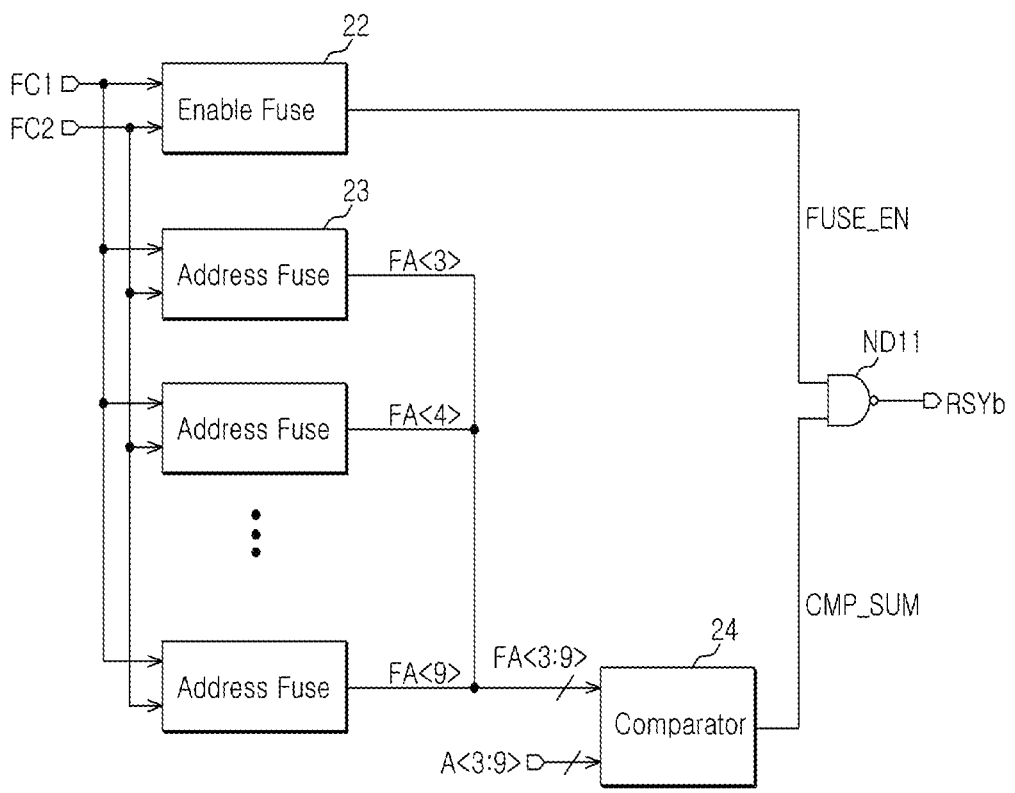
FIG. 2 is diagram illustrating the internal configuration of the fuse set illustrated in FIG. 1.
Figure 3A:
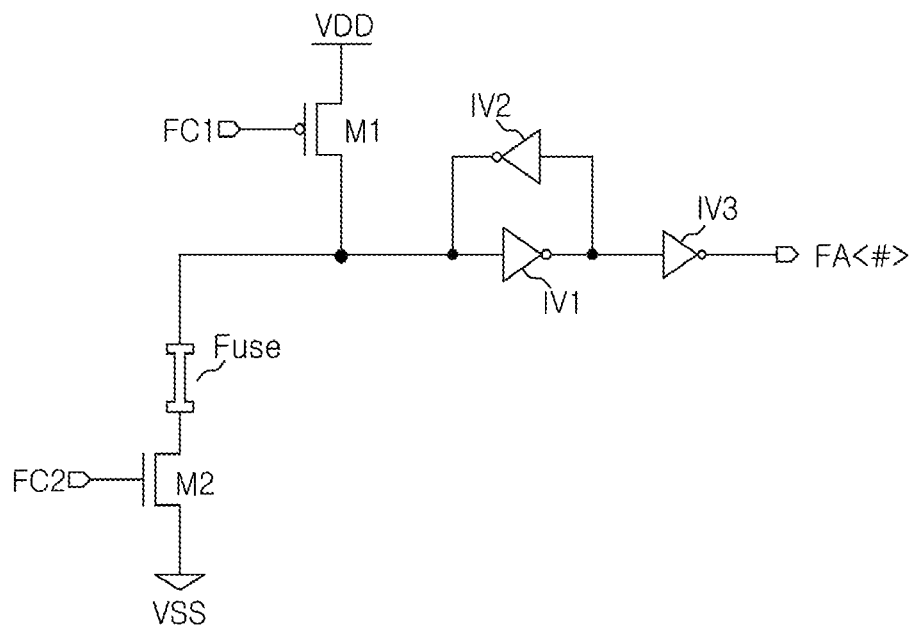
FIG. 3A is a circuit diagram of the address fuse illustrated in FIG. 2.
Figure 3B:
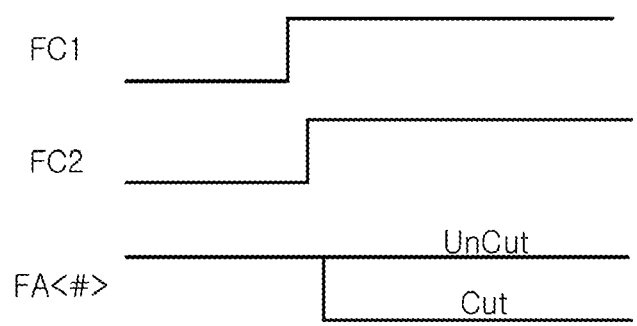
FIG. 3B is a diagram illustrating the operation timing of the address fuse illustrated in FIG. 2.

The plurality of address fuses 23 may have substantially the same configuration as those illustrated in FIGS. 2 and 3A. The address fuse 23 can be any one of a laser rupture type fuse or an electricity rupture type fuse.

When a fuse has been ruptured, the plurality of address fuses 23 output fuse signals FA<3:9> at a logic high level. When the fuse has not been ruptured, the plurality of address fuses 23 output the fuse signals FA<3:9> at a logic low level.

The comparator 211 is configured to compare the address signals A<3:9> with the fuse signals FA<3:9> and output the primary repair signal RYSb<0>. When the address signals A<3:9> match the fuse signals FA<3:9>, the comparator 24 outputs the primary repair signal RYSb<0> at a logic low level. When the address signals A<3:9> do not match the fuse signals FA<3:9>, the comparator 24 outputs the primary repair signal RYSb<0> at a logic high level.

The plurality of fuse sets fuse set 1 to fuse set 3 may have substantially the same configuration as that of the fuse set 0 (210).

The fuse set 0 (210) according to the embodiment of the invention does not include the enable fuse 22 and the NAND gate ND11 which are included in the conventional fuse set 0 (21) illustrated in FIG. 2.

The conventional art uses the enable fuse 22 in order to determine the use or non-use of a fuse set, that is, the fuse set 0 (21) is to be used, or an address '0 (decimal number)' is to be repaired.

Meanwhile, according to the embodiment of the invention, when there is an unused fuse set (in which a fuse is not ruptured) among the plurality of fuse sets fuse set 0 to fuse set 3, the fuse of the unused fuse set is ruptured according to a specific address.

Thus, all the fuse sets fuse set 0 to fuse set 3 are used, resulting in no use of an enable fuse for determining the use or non-use of a fuse set.

The fuse of the unused fuse set is ruptured, so that the normal column lines NY<0:N> corresponding to stored specific addresses are replaced with the redundant column lines RY<0:3>.

At this time, the number of addresses to be replaced by a fail occurring in the memory block 10, that is, the cell mat, is approximately one or two, but a repair circuit is configured to replace four addresses for the purpose of stability.

Figure 6:
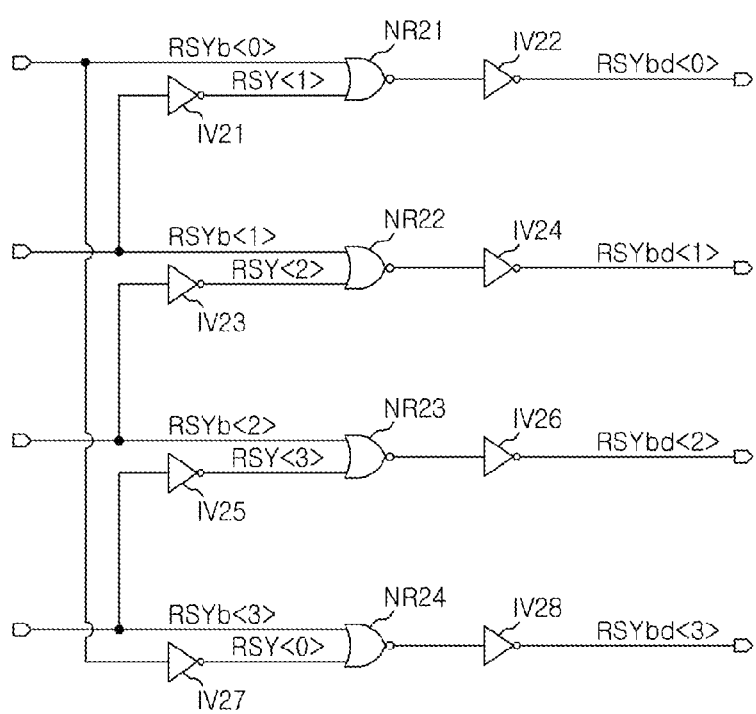
FIG. 6 is a circuit diagram of the control block illustrated in FIG. 4.

FIG. 6 is a circuit diagram of the control block illustrated in FIG. 4. As illustrated in FIG. 6, the redundancy control block 300 may include a plurality of inverters IV21 to IV28 and a plurality of NOR gates NR21 to NR24.

The redundancy control block 300 is configured to compare one of signal bits of the primary repair signals RYSb<0:3> with a signal bit adjacent to the one signal bit, determine whether a repair cell in the repair memory designated by the primary repair signal is failed or not, and generate the secondary repair signals RYSbd<0:3> is which repair the failed repair cell with another repair cell in the repair memory.

According to the embodiment of the invention, all the fuse sets fuse set 0 to fuse set 3 are used, resulting in no use of the enable fuse.

However, if there is a failed cell in redundant cells, it is not possible to apply the embodiment of the invention.

In this regard, the redundancy control block 300 is provided in order to secondarily repair the failed cell in the redundant cells.

Figure 7A:
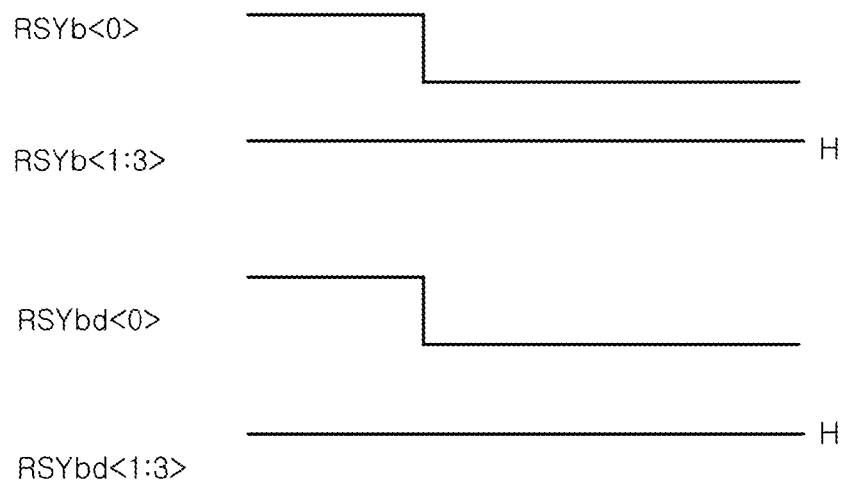
FIGS. 7A and 7B are diagrams illustrating the operation timing of the control block illustrated in FIG. 6.
Figure 7B:
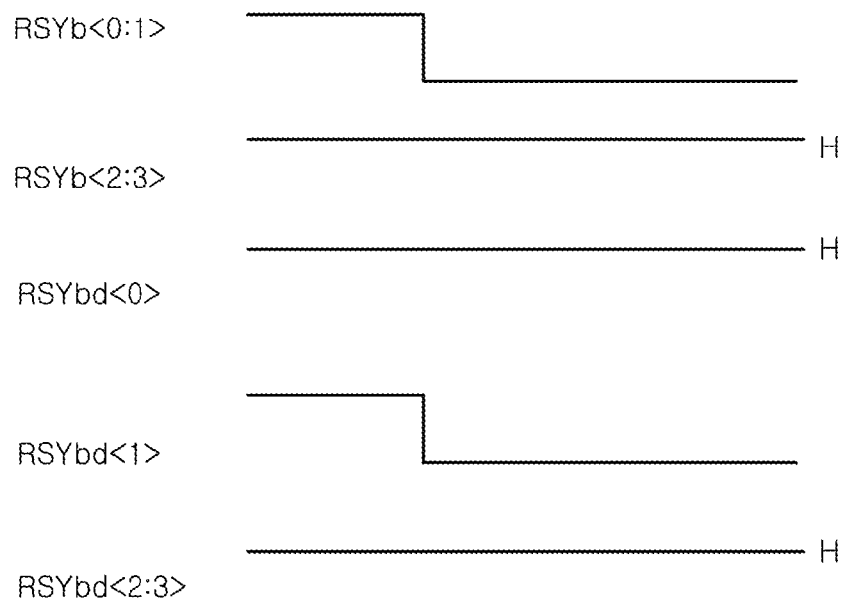

FIGS. 7A and 7B are diagrams illustrating the operation timing of the control block illustrated in FIG. 6. As illustrated in FIG. 7A, when there is no failed cell in the redundant cells, the primary repair signal RYSb<0> of the primary repair signals RYSb<0:3>, which match the address signals A<3:9>, is activated to a logic low level, and the others are activated to a logic high level.

Thus, the redundancy control block 300 illustrated in FIG. 6 is configured to output only the secondary repair signal RYSbd<0> of the secondary repair signals RYSbd<0:3> at a logic low level.

Meanwhile, as illustrated in FIG. 7B, when there is a failed cell in the redundant cells and it is not possible to use the fuse set 0 (210) related to the failed cell, the address fuses 23 of the fuse set 0 and the fuse set 1 are ruptured such that the same address is stored in the fuse set 0 and the fuse set 1.

The primary repair signals RYSb<0:1> of the primary repair signals RYSb<0:3>, which match the address signals A<3:9>, are activated to a logic low level, and the others are activated to a logic high level.

The NOR gate NR21 of the redundancy control block 300 illustrated in FIG. 6 is configured to deactivate the secondary repair signal RYSbd<0> to a logic high level because the primary repair signal RYSb<0> is at a logic low level but an output signal RSY<1> of the inverter IV21 is at a logic high level.

The NOR gate NR22 is configured to activate the secondary repair signal RYSbd<1> to a logic low level because both the primary repair signal RYSb<1> and an output signal RSY<2> of the inverter IV23 are at a logic low level.

The NOR gates NR23 and NR24 are configured to deactivate the secondary repair signals RYSbd<2:3> to a logic high level regardless of the output of the inverters IV25 and IV27 because the primary repair signals RYSb<2:3> are at a logic high level.

The primarily repaired failed redundant cell is secondarily repaired by the operation of the redundancy control block 300 as described above through the method according to the embodiment of the invention. Similarly to this, it is possible to perform secondary repair by shifting RYSb<1> to RYSb<2>, RYSb<2> to RYSb<3>, and RYSb<3> to RYSb<0>.

On the basis of the address signals A<3:9>, each of the conventional fuse sets fuse set 0 to fuse set 3 needs eight fuses (address fuses and an enable fuse).

However, according to the embodiment of the invention, is each of the fuse sets fuse set 0 to fuse set 3 needs only seven fuses.

As a result, according to the embodiment of the invention, it is possible to reduce the area of the fuse set in the repair circuit by 12.5% as compared with the conventional art.

According to the embodiment of the present invention, all fuse sets are allowed to be used by designating an arbitrary address even when a fuse set does not need to be used, so that there is no necessity for an enable fuse, resulting in a reduction in the area of a repair circuit.

While certain embodiments have been described above, it will be understood to those skilled in the art that the embodiments described are by way of example only. Accordingly, the repair circuit and the control method thereof described herein should not be limited based on the described embodiments. Rather, the repair circuit and the control method thereof described herein should only be limited in light of the claims that follow when taken in conjunction with the above description and accompanying drawings.

What is claimed is:

1. A semiconductor memory apparatus including a repair circuit, comprising:
   a fuse set block including one or more fuse set configured to store one of a first address corresponding to a failed memory cell and a second address unrelated with a fail as a repair address, compare the repair address with an input address, and generate a primary repair signal; and
   a redundancy control block configured to receive the primary repair signal, determine whether a repair cell in a repair memory designated by the primary repair signal is failed or not, and generate a secondary repair signal which repair the failed repair cell with another repair cell in the repair memory.

2. The semiconductor memory apparatus according to claim 1, wherein each of the one or more fuse set comprises: a plurality of address fuses configured to store the repair address; and a comparator configured to compare the repair address with the input address and generate the primary repair signal.

3. The semiconductor memory apparatus according to claim 1, wherein the redundancy control block is configured to compare one of signal bits of the primary repair signal with a signal bit adjacent to the one signal bit, determine whether the repair cell designated by the one signal bit is failed or not, and generate the secondary repair signal.

4. The semiconductor memory apparatus according to claim 1, wherein one or more fuse of each of all the one or more fuse set is cut.

5. A method of controlling a repair circuit including a plurality of fuse sets, comprising:

when a failed memory cell exists, storing an address corresponding to the failed memory cell to one of the plurality of fuse sets, and storing a specific address unrelated with the failed memory cell to each of the others of the plurality of fuse sets; and when no failed memory cell exists, storing a specific address unrelated with the failed memory cell to each of all the plurality of fuse sets.

6. The method according to claim 5, wherein, when the address corresponding to the failed memory cell has a value of '0 (decimal number)', an address having a value different from a value of the address corresponding to the failed memory cell is stored in the one of the plurality of fuse sets.

7. The method according to claim 5, wherein, when the address corresponding to the failed memory cell has a value other than '0 (decimal number)', the address corresponding to the failed memory cell is stored in the one of the plurality of fuse sets.

8. The method according to claim 5, wherein, when a redundant memory cell corresponding to the failed memory cell by the one of the plurality of fuse sets is normal, the specific address has a value different from a value of the address corresponding to the failed memory cell.

9. The method according to claim 5, wherein, when a redundant memory cell corresponding to the failed memory cell by the one of the plurality of fuse sets is failed, the specific address has a value substantially equal to a value of the address corresponding to the failed memory cell.

10. The method according to claim 5, wherein one or more fuse of each of all the plurality of fuse sets is cut.

* * * * *